(12) United States Patent
Cabrera et al.

(10) Patent No.: US 7,005,996 B2
(45) Date of Patent: Feb. 28, 2006

(54) POWER DISTRIBUTION PANEL WITH MODULAR INSERTS

(75) Inventors: Carlos Cabrera, Ciudad Juarez (MX); Delfino Hernandez, Juarez (MX); David J. Johnsen, New Hope, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 110 days.

(21) Appl. No.: 10/319,456

(22) Filed: Dec. 13, 2002

(65) Prior Publication Data

US 2004/0113804 A1    Jun. 17, 2004

(51) Int. Cl.
*G08B 21/00* (2006.01)

(52) U.S. Cl. ................. 340/639; 340/693.12; 361/633; 361/634; 361/636; 361/638; 361/640; 361/644; 361/652; 361/655; 361/657; 361/730; 174/50; 174/60; 174/65 R; 439/540.1; 439/544

(58) Field of Classification Search ............... 340/663, 340/662, 659, 638, 639, 693.5, 693.9; 361/627, 361/630, 633, 634, 673, 676, 727, 731, 735
See application file for complete search history.

(56) References Cited

U.S. PATENT DOCUMENTS

| | | | |
|---|---|---|---|
| 3,590,325 A * | 6/1971 | McMillen et al. ............ 361/92 |
| 5,204,800 A | 4/1993 | Wasney | |
| 6,038,126 A | 3/2000 | Weng | |
| 6,067,023 A * | 5/2000 | Bendikas ..................... 340/638 |
| 6,160,699 A | 12/2000 | Gibson et al. | |
| 6,331,933 B1 | 12/2001 | Rumney | |
| 6,421,215 B1 | 7/2002 | Bushue | |
| 6,456,203 B1 | 9/2002 | Schomaker et al. | |
| 6,719,149 B1 * | 4/2004 | Tomino ........................ 211/26 |
| 2002/0020682 A1 | 2/2002 | Broome | |

FOREIGN PATENT DOCUMENTS

| | | |
|---|---|---|
| WO | WO 01/72098 A2 | 9/2001 |
| WO | WO 01/76030 A2 | 10/2001 |

OTHER PUBLICATIONS

ADC Telecommunications, Inc., PowerWorx™ Power Distribution Products brochure, dated Aug. 2000.
Hendry Telephone Products power distribution product information pp. 4-9, 12-35, and 38 to 43, undated.
Exhibit A—Drawings from Cisco Systems, Inc. for Stagecoach PDU power distribution panel products, 37 sheets (admitted as prior art).

* cited by examiner

*Primary Examiner*—Benjamin C. Lee
(74) *Attorney, Agent, or Firm*—Merchant & Gould P.C.

(57) ABSTRACT

A power distribution panel with a chassis defining an interior with a first opening and a second opposing opening. The panel including a module with a bottom, a first face and a second face, and including a power input terminal, a plurality of power output terminals, and an electrical circuit connecting each power output terminal to the power input terminal, each circuit including a circuit protection device. The power input terminal, the power output terminals and the circuit protection devices are mounted to one of the first or second faces. The module is configured to be received through the first opening and removably mounted within the interior so that the power input terminal, the power output terminals and the circuit protection devices are accessible through one of the first and second openings when the module is mounted within the chassis. A module including power distribution components and circuitry adapted to be removably mounted within a power distribution panel chassis.

25 Claims, 23 Drawing Sheets

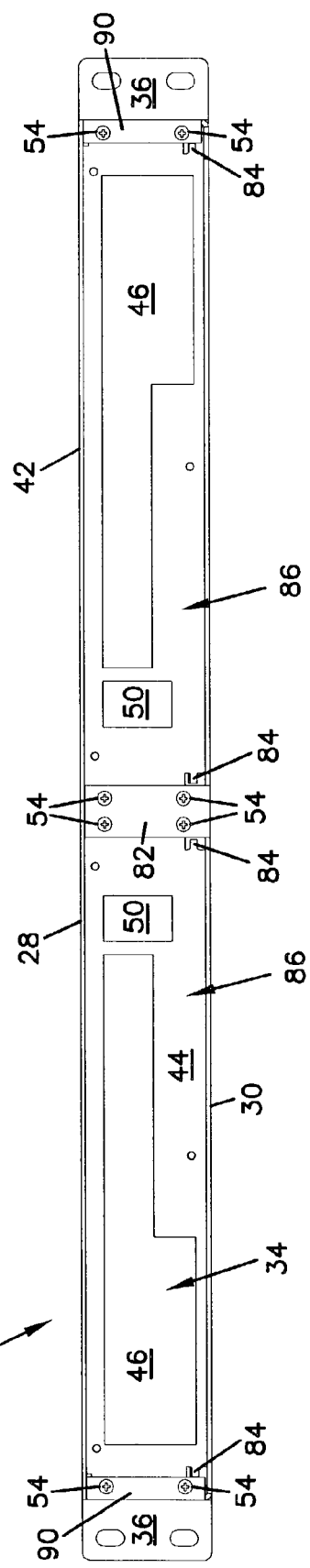
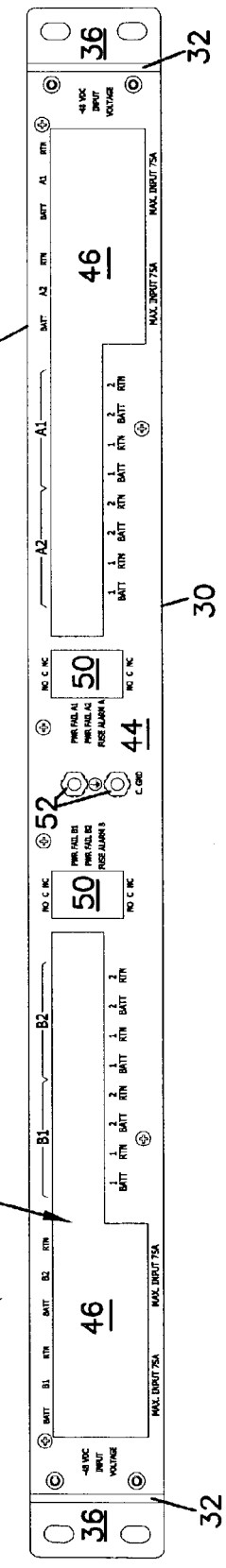

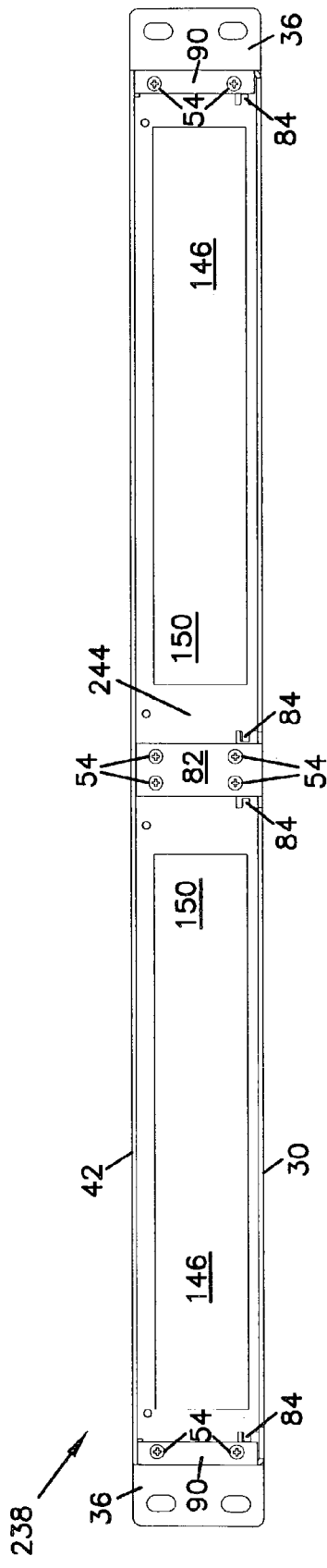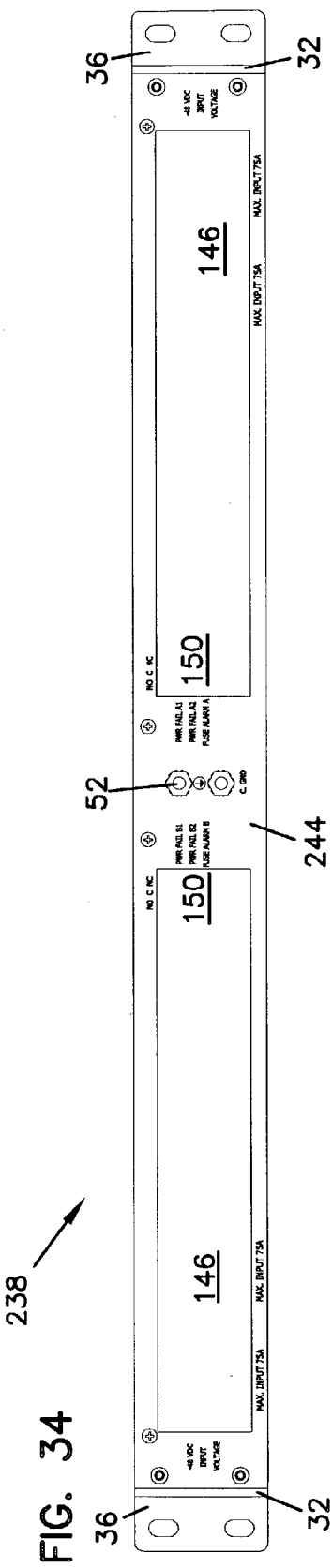

POWER DISTRIBUTION PANEL WITH MODULAR INSERTS

FIELD OF THE INVENTION

The present invention relates generally to power distribution panels. More particularly, the present invention relates to power distribution panels with modular inserts.

BACKGROUND OF THE INVENTION

In telecommunication installations, equipment is often mounted in equipment racks. These racks permit greater density and organization of installation for this equipment. To simplify the provision of power to the equipment mounted within a rack, power distribution panels may be mounted in the same rack. These power distribution panels have one or more power input terminals to which higher capacity power supply cables may be attached. Within the panels is circuitry for distributing the current from the power input terminals to one or more power output terminals. From the output terminals, electrical cables may be led to the telecommunications equipment mounted within the rack. The circuits within the power distribution panel may also include circuit protection devices such as circuit breakers or fuses.

To maximize the amount of rack space that can be devoted to telecommunications equipment, it is desirable to make the power distribution panels as compact as possible. The compact nature of the panels may make it difficult to access the interior of a panel, for instance, for repairs or routine maintenance. However, removal of a panel from a rack may result in the equipment within that rack being depowered during the repair or maintenance. Removing the equipment and any circuits the equipment may support from service costs the service provider in terms of lost revenue.

Many of the power distribution panels include two or more discrete power distribution circuits within a single panel. Often, only one of these circuits requires repair or maintenance, but both circuits must be taken offline when the panel is removed from the rack. Improvements to power distribution panels are desirable which allow individual circuits within a power distribution panel to be accessed for repair or maintenance without removing all circuits of the panel from service.

SUMMARY OF THE INVENTION

The present invention relates to a power distribution panel where the power distribution components and circuitry are mounted in a removable module. The module can be removed from the power distribution panel without disconnecting any other modules within the panel.

The present invention further relates to a module including the components and circuitry to distribute power to other devices. The module is adapted to be removably mounted within a chassis to form a power distribution panel. The module may be inserted or removed from the chassis without disrupting other modules which are mounted to the chassis.

The present invention further relates to a method of replacing a power distribution module of a power distribution panel.

BRIEF DESCRIPTION OF THE DRAWINGS

The accompanying drawings, which are incorporated in and constitute a part of the specification, illustrate several aspects of the invention and together with the description, serve to explain the principles of the invention. A brief explanation of the drawings is as follows:

FIG. 15 is a front view of the chassis of the power panel of FIG. 1 with no modules inserted.

FIG. 16 is a rear view of the chassis of FIG. 15.

FIG. 33 is a front view of a chassis of FIG. 15 with an alternative universal back plate.

FIG. 34 is a rear view of the chassis of FIG. 33.

DETAILED DESCRIPTION OF THE PREFERRED EMBODIMENTS

Reference now will be made in detail to exemplary aspects of the present invention that are illustrated in the accompanying drawings. Wherever possible, the same reference numbers will be used throughout the drawings to refer to the same or like parts.

Figure 1:
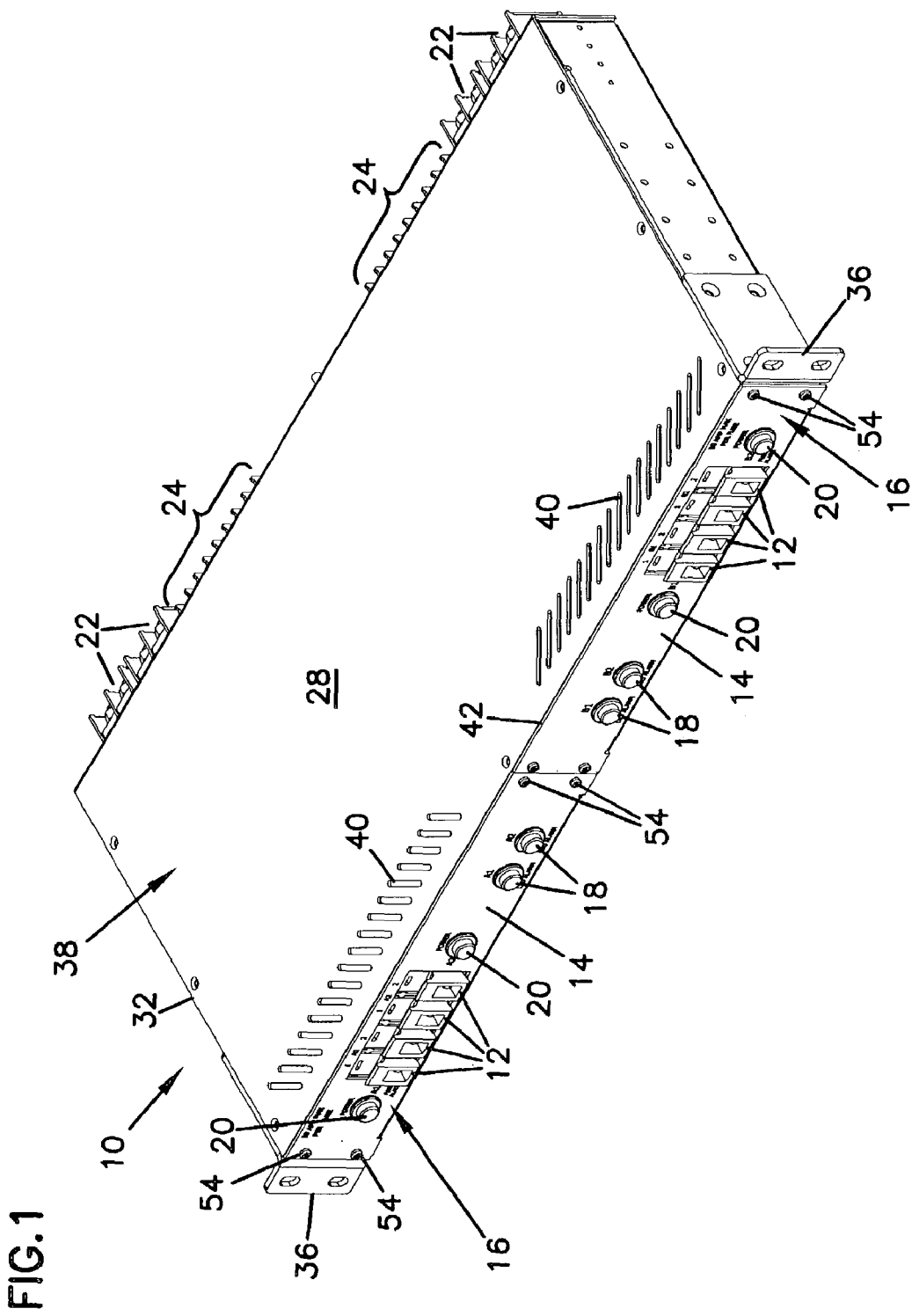
FIG. 1 is a front perspective view of a power panel in accordance with the present invention.
Figure 2:
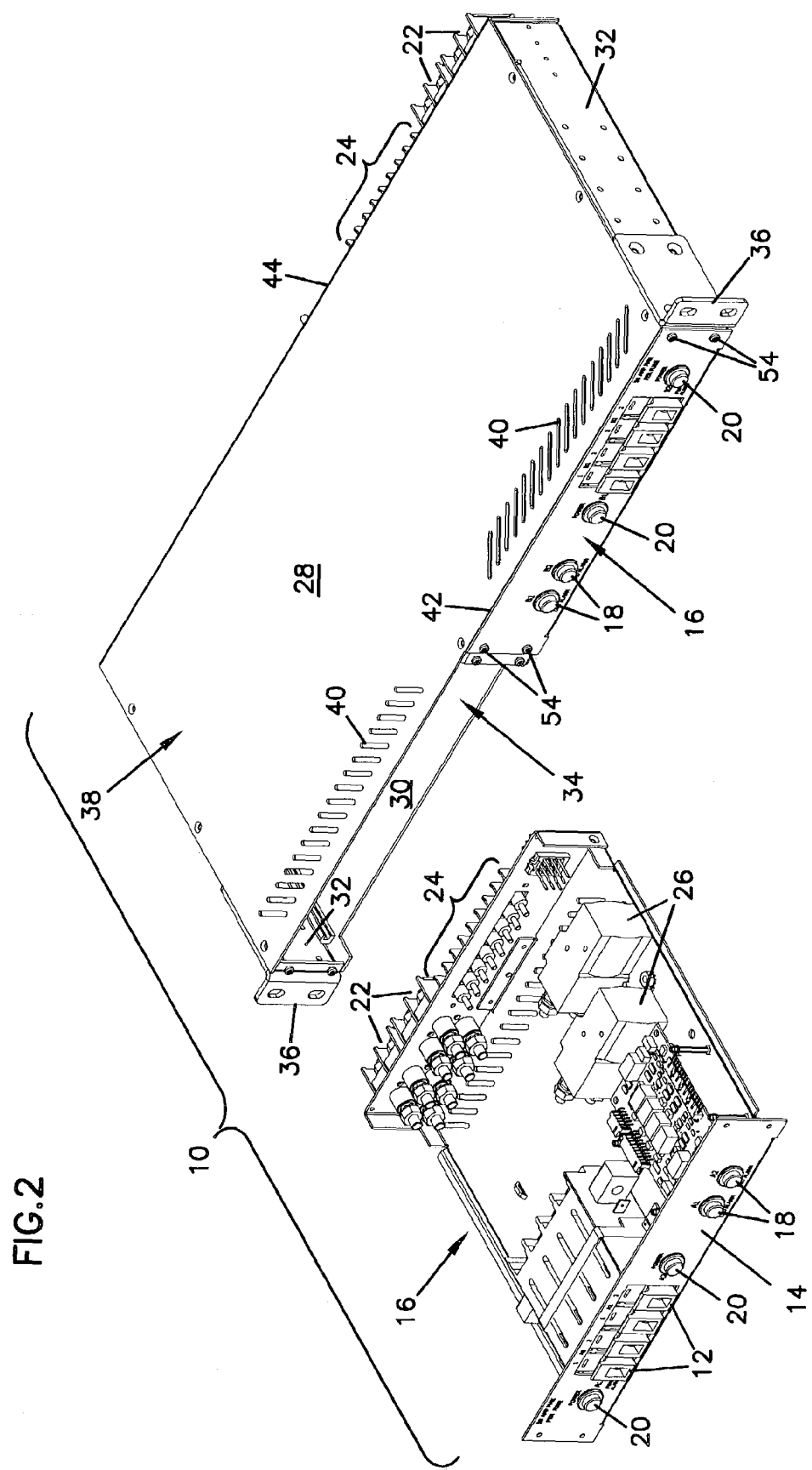
FIG. 2 is a front perspective view of the power panel of FIG. 1, with one of the modules exploded.
Figure 3:
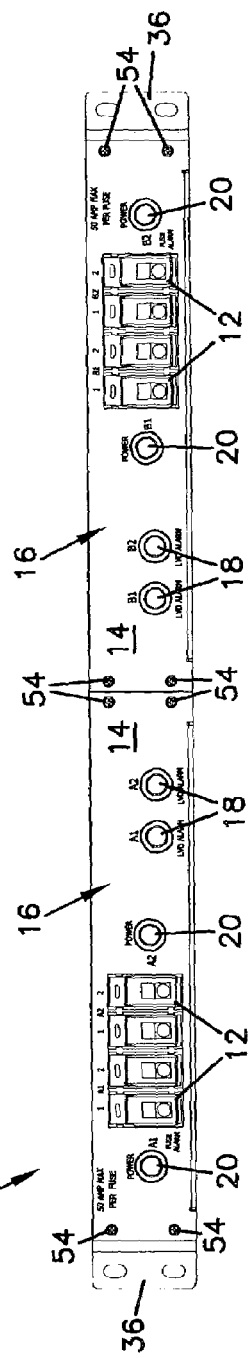
FIG. 3 is a front view of the power panel of FIG. 1.

Power distribution panels such as panel 10 shown in FIGS. 1 and 2 may be used to provide power for telecommunications or other electronic equipment mounted in equipment racks. The telecommunications or other electronic equipment is may be sensitive to fluctuations in the electrical power being supplied, and damaged by over-current or over-voltage conditions. Thus, panel 10 includes a plurality of circuit protection devices 12 mounted to a front face 14. Panel 10 includes two separate power busses, one in each of two modules 16 which on each side of panel 10.

Each of the modules 16 shown in FIG. 1 has four circuit protection devices 12, which as shown are TPA fuses, each fuse 12 providing over-current and over-current protection to one of four power supply circuits within each module 16.

Figure 14:
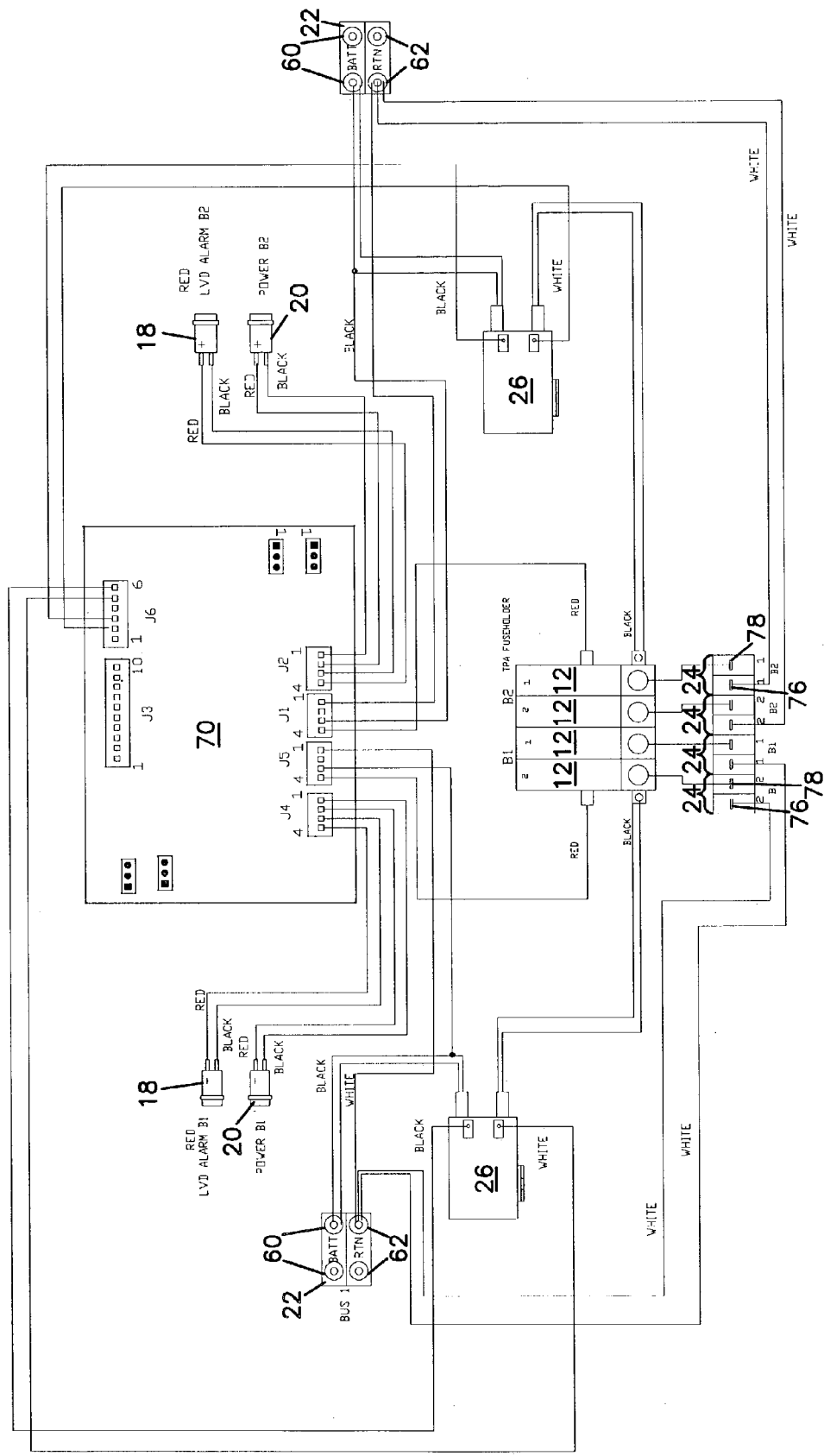
FIG. 14 is a schematic diagram of the circuitry included in the module of FIG. 9.
Figure 17:
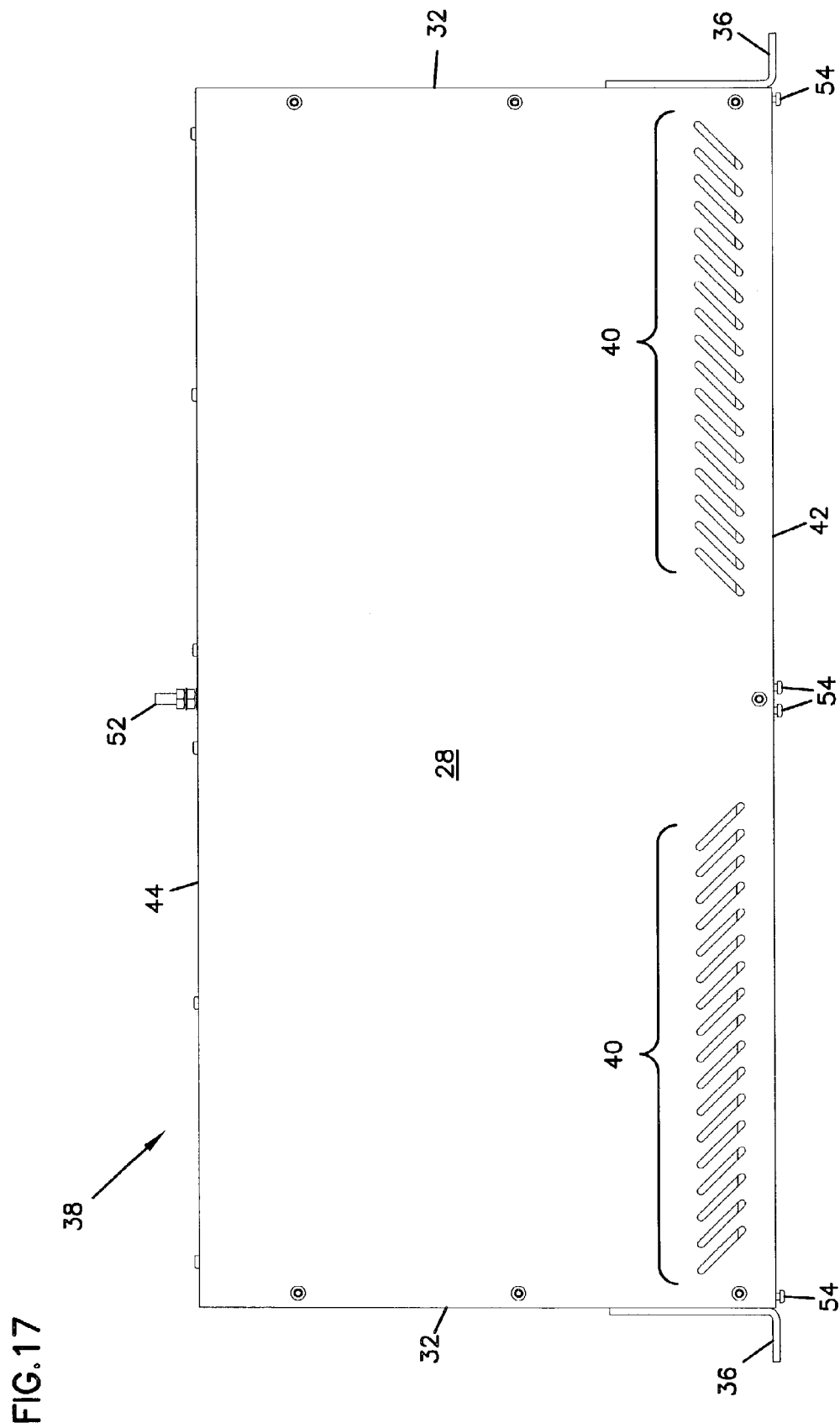
FIG. 17 is a top view of the chassis of FIG. 15.
Figure 18:
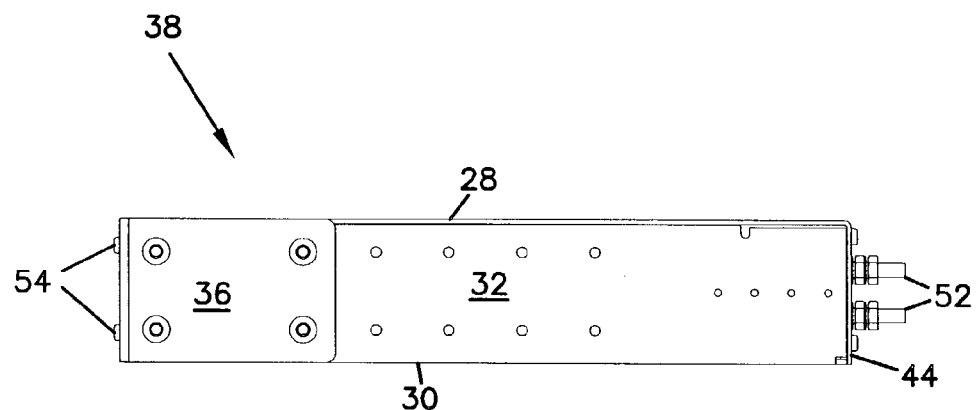
FIG. 18 is a first side view of the chassis of FIG. 15.
Figure 19:
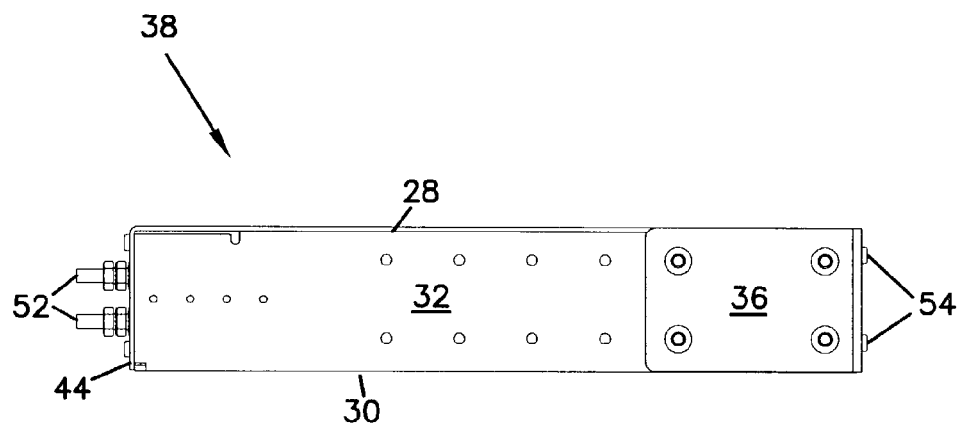
FIG. 19 is a second side view of the chassis of FIG. 15.
Figure 20:
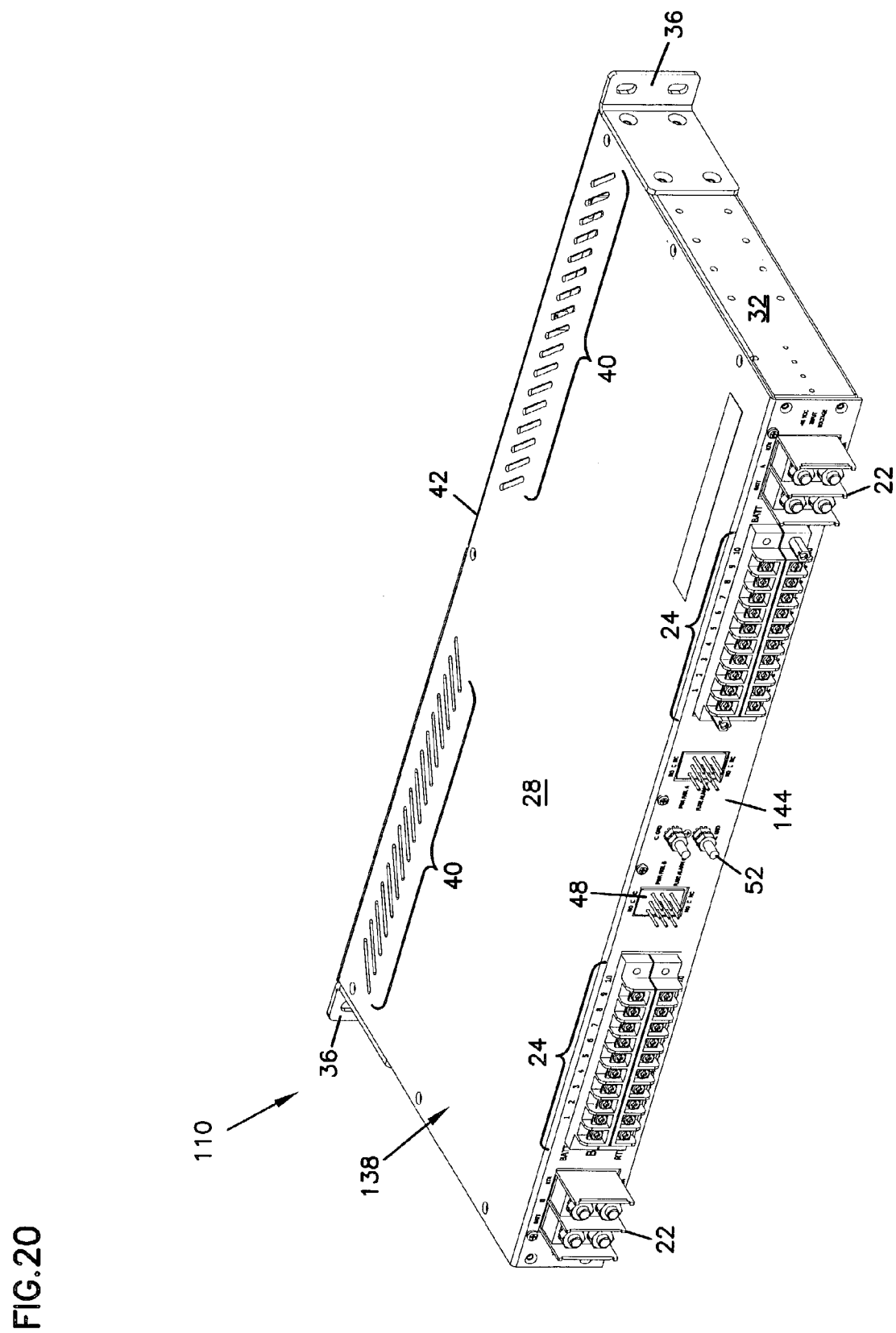
FIG. 20 is a rear perspective view of a second embodiment of a power panel in accordance with the present invention.
Figure 21:
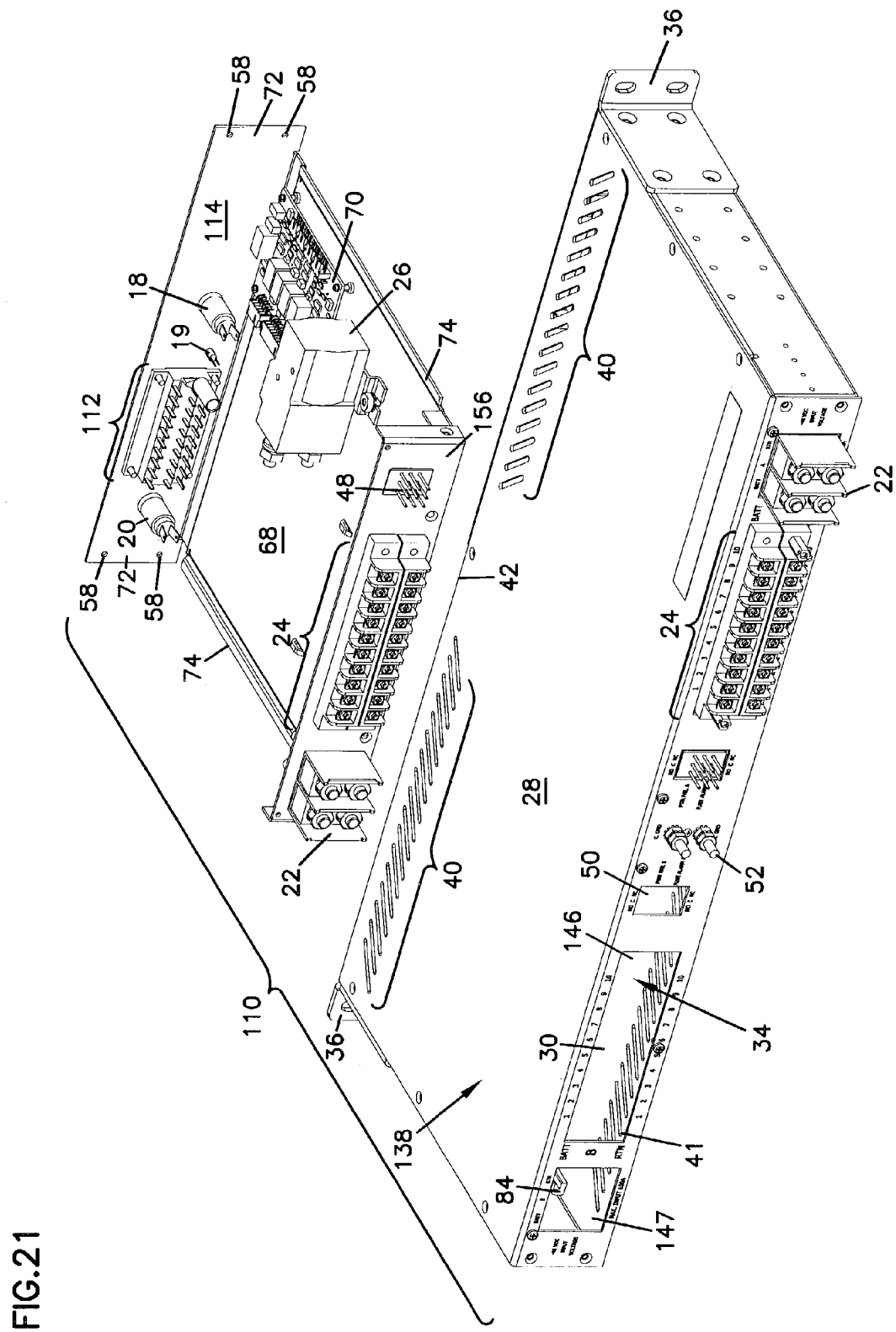
FIG. 21 is a rear perspective view of the power panel of FIG. 20, with one of the modules exploded.
Figure 22:
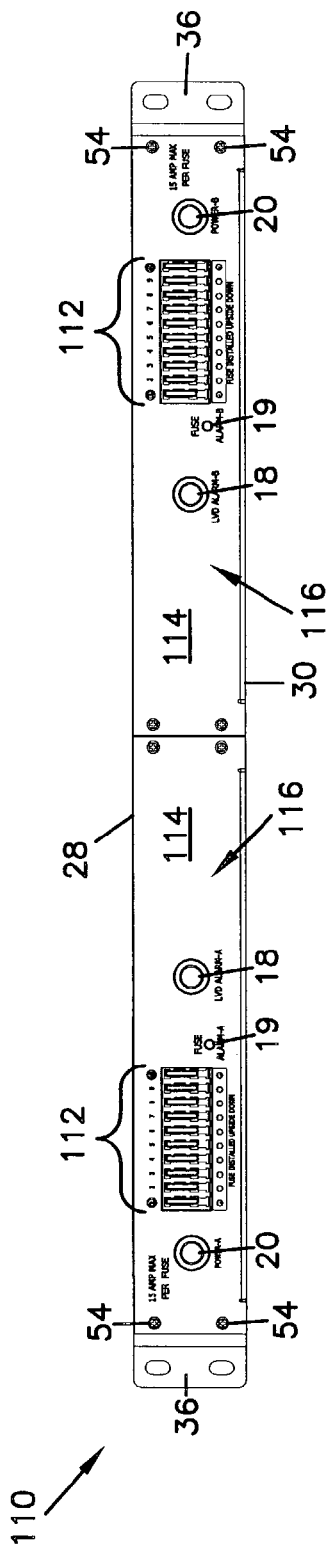
FIG. 22 is a front view of the power panel of FIG. 20
Figure 23:
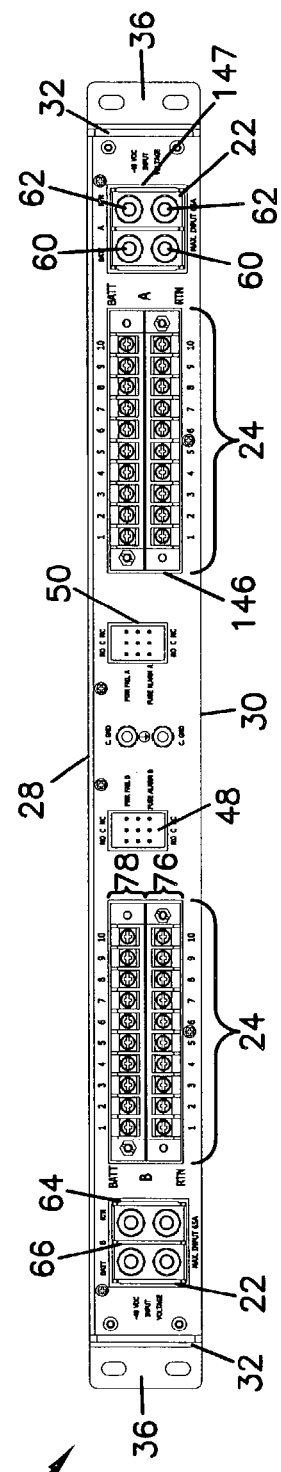
FIG. 23 is a rear view of the power panel of FIG. 20.
Figure 24:
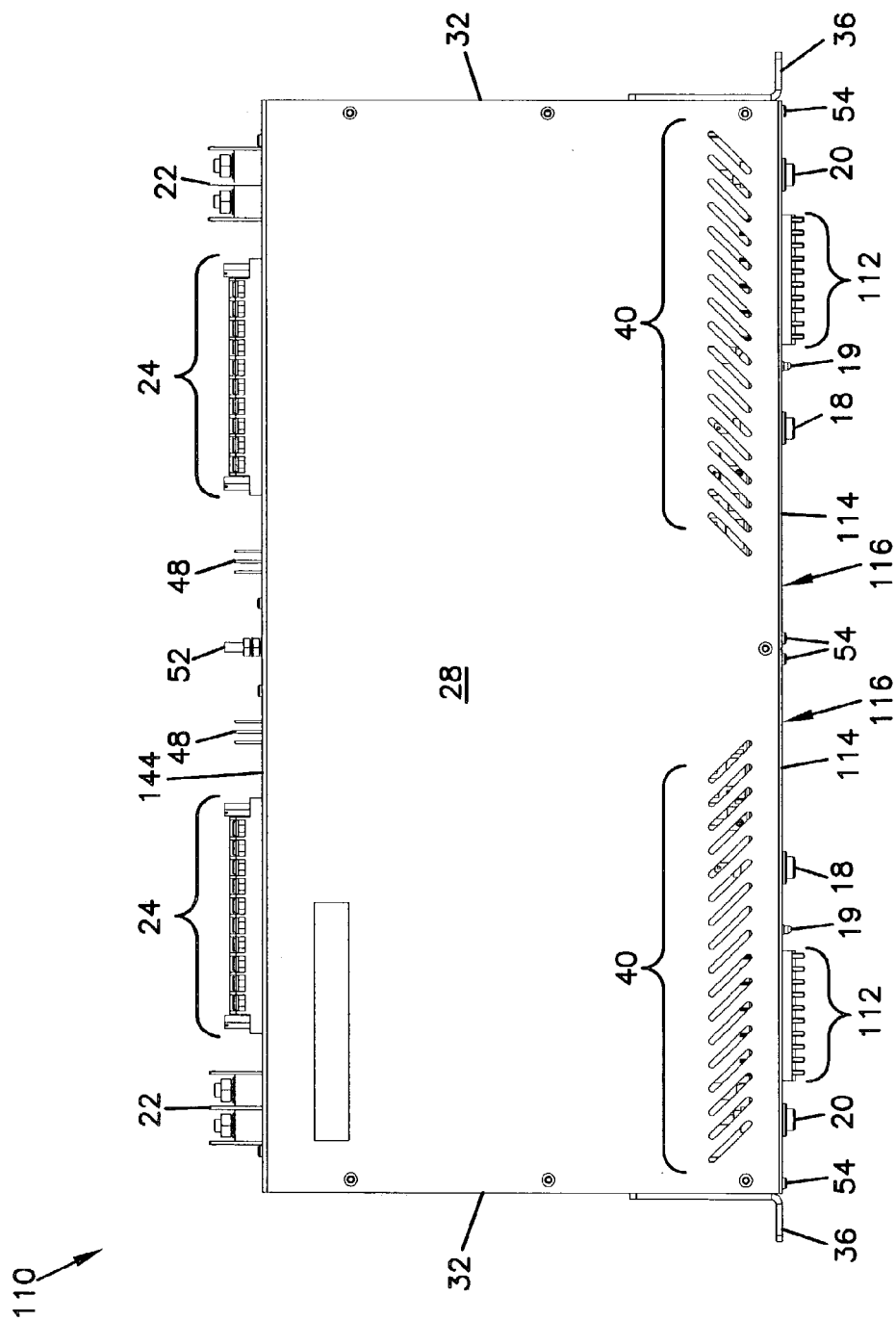
FIG. 24 is a top view of the power panel of FIG. 20.
Figure 25:
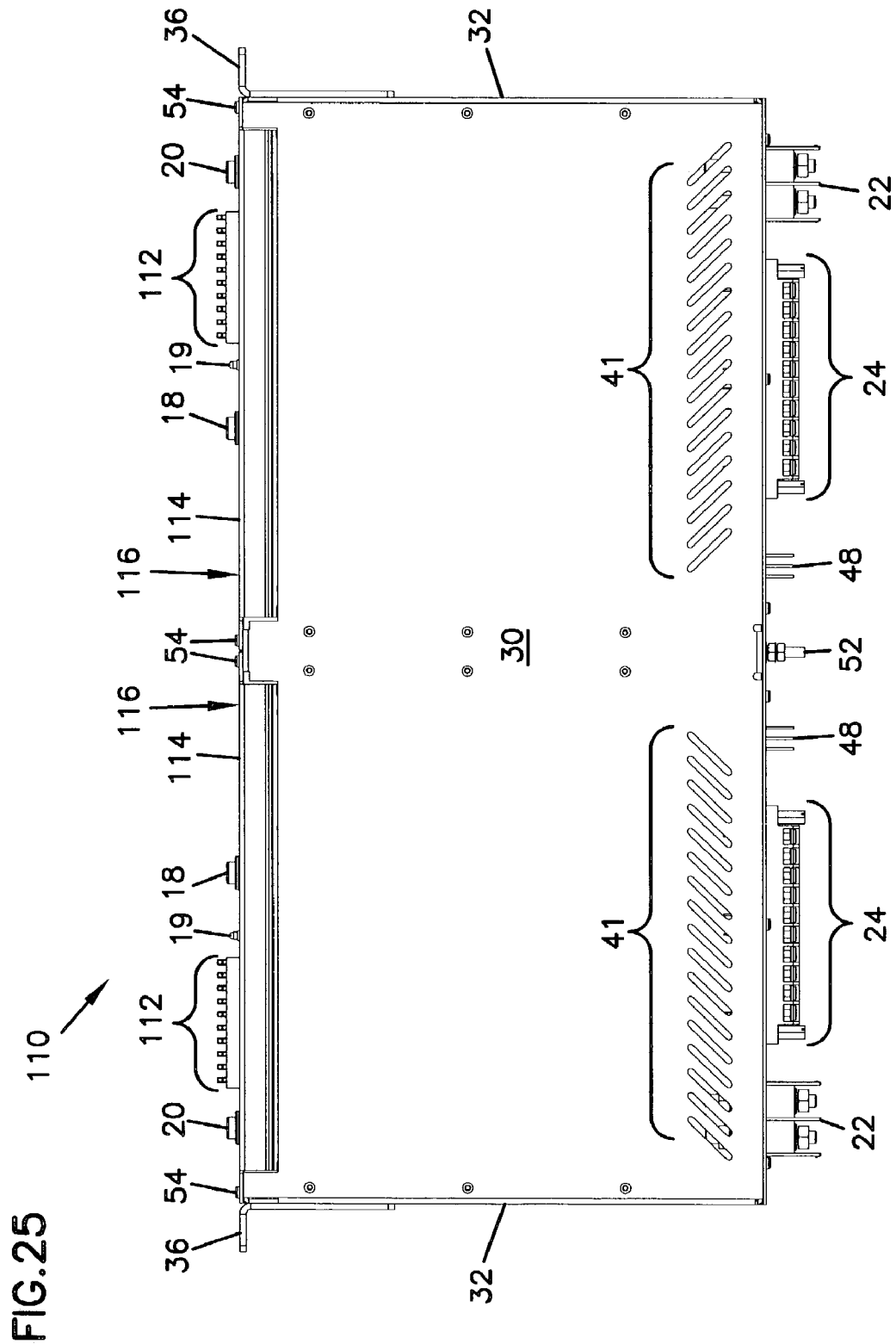
FIG. 25 is a bottom view of the power panel of FIG. 20.
Figure 26:
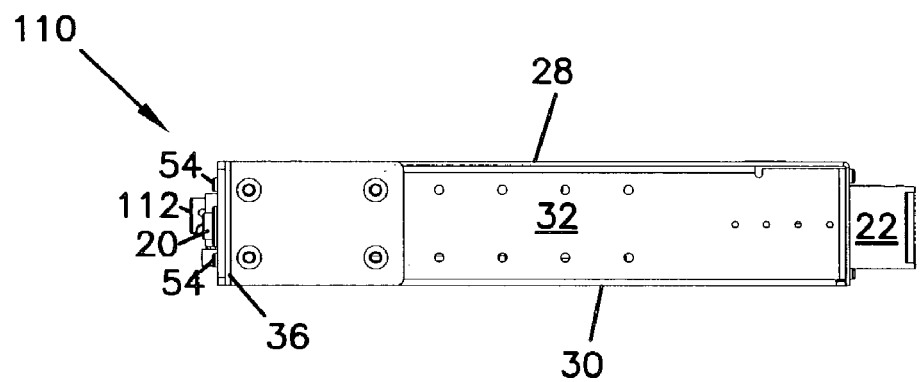
FIG. 26 is a first side view of the power panel of FIG. 20.
Figure 27:
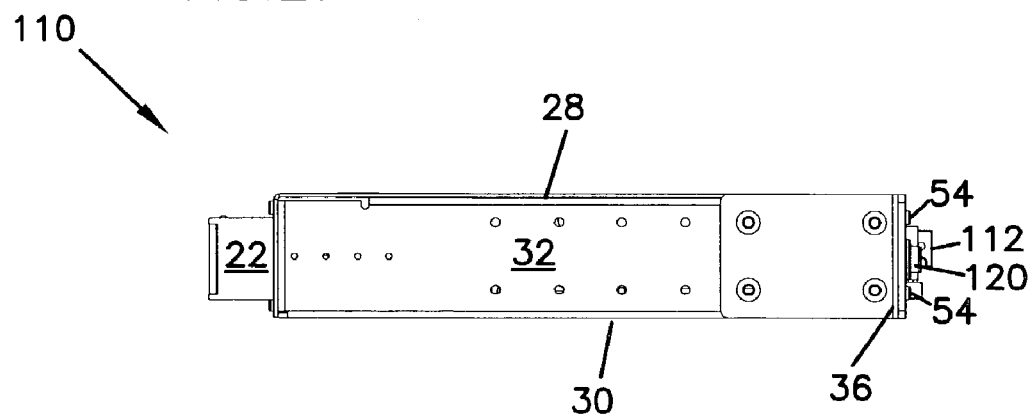
FIG. 27 is a second side view of the power panel of FIG. 20.
Figure 28:
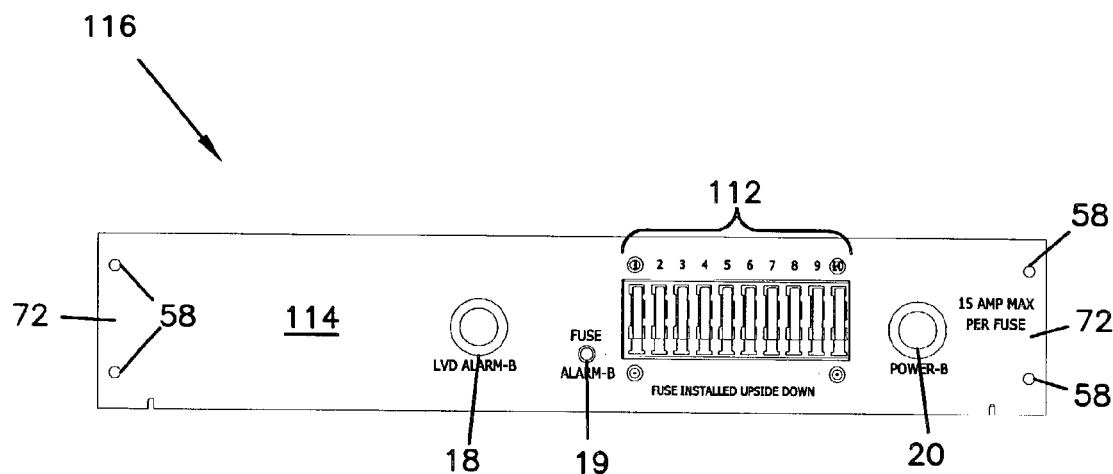
FIG. 28 is a front view of one of the modules of the power panel of FIG. 20.
Figure 29:
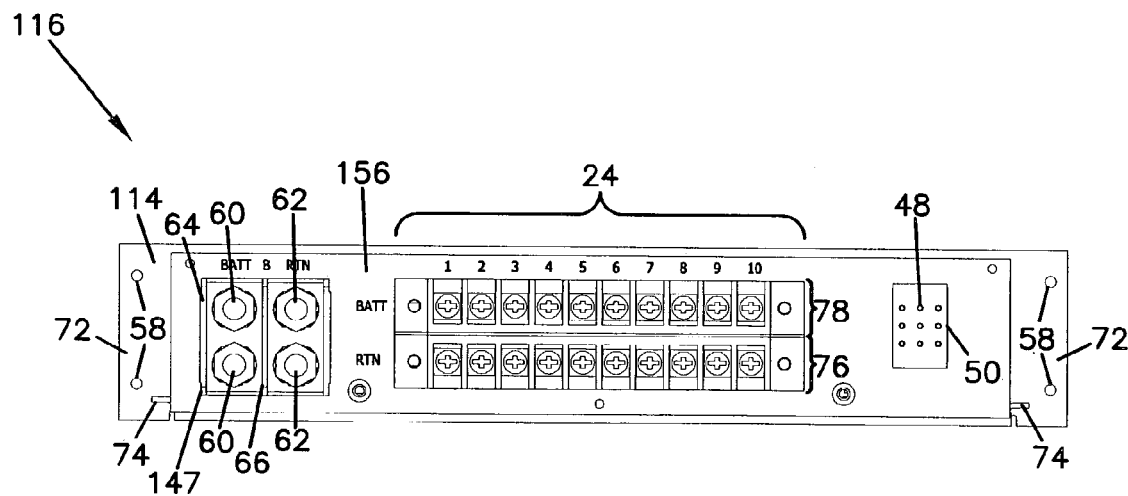
FIG. 29 is a rear view of the module of FIG. 28.
Figure 30:
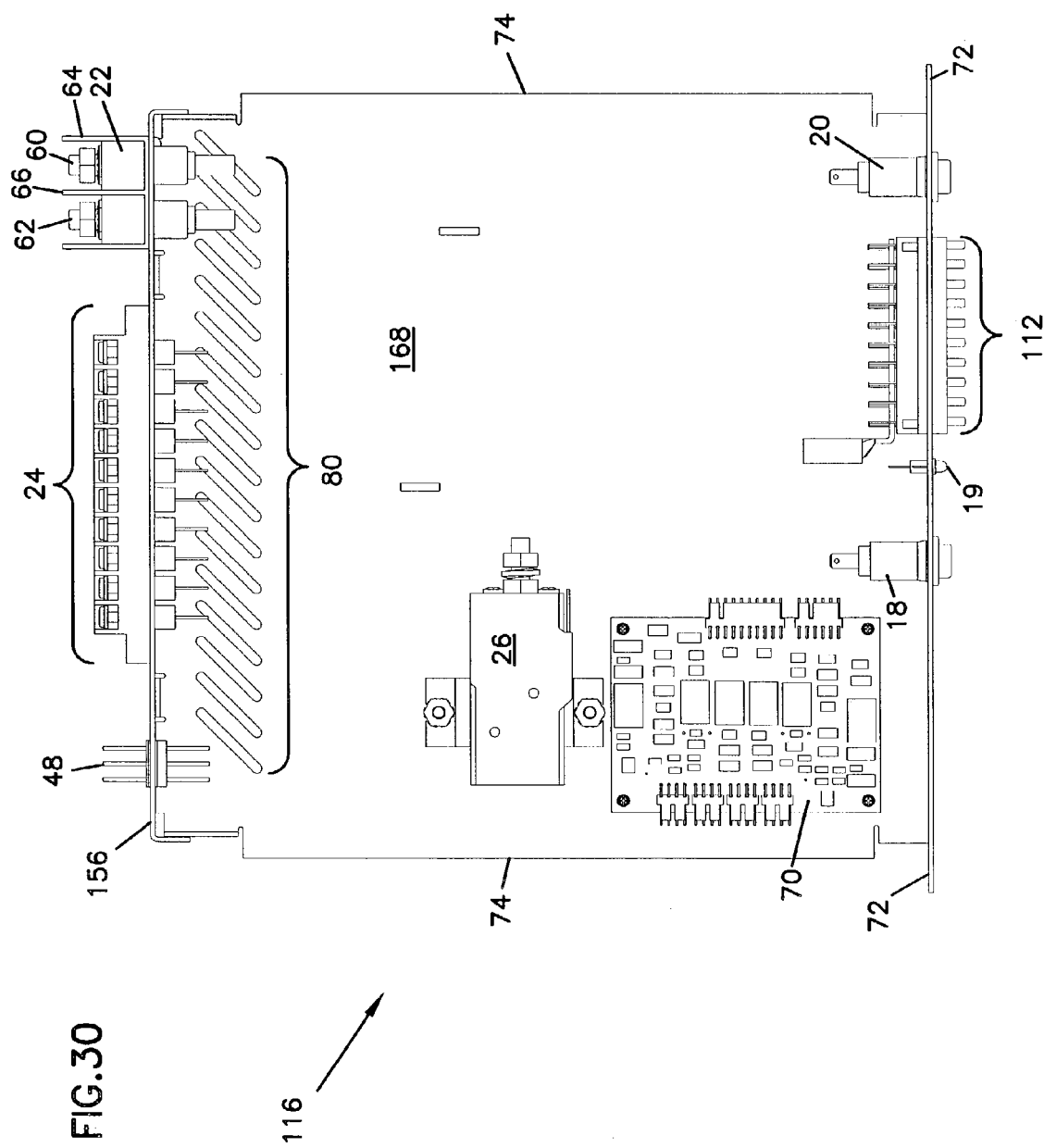
FIG. 30 is a top view of the module of FIG. 28.
Figure 31:
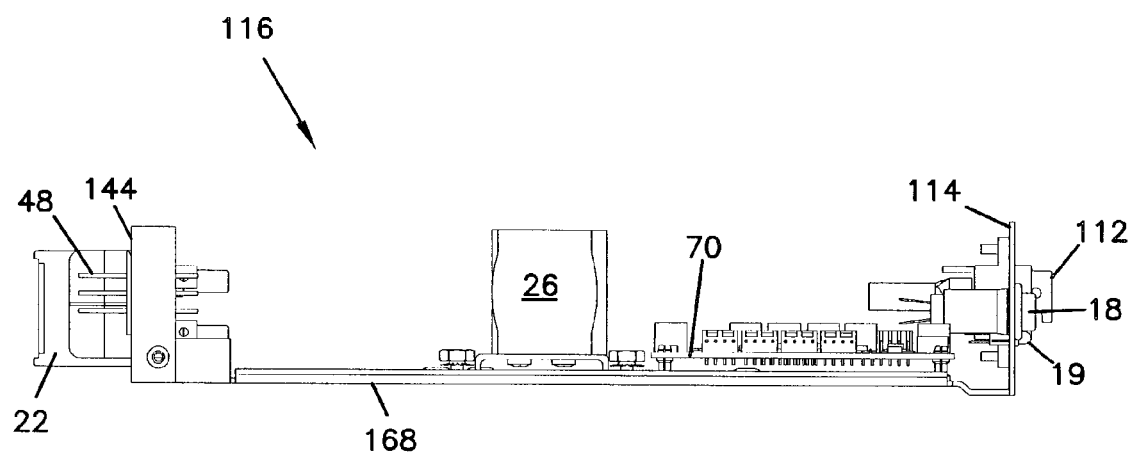
FIG. 31 is a first side view of the module of FIG. 28.
Figure 32:
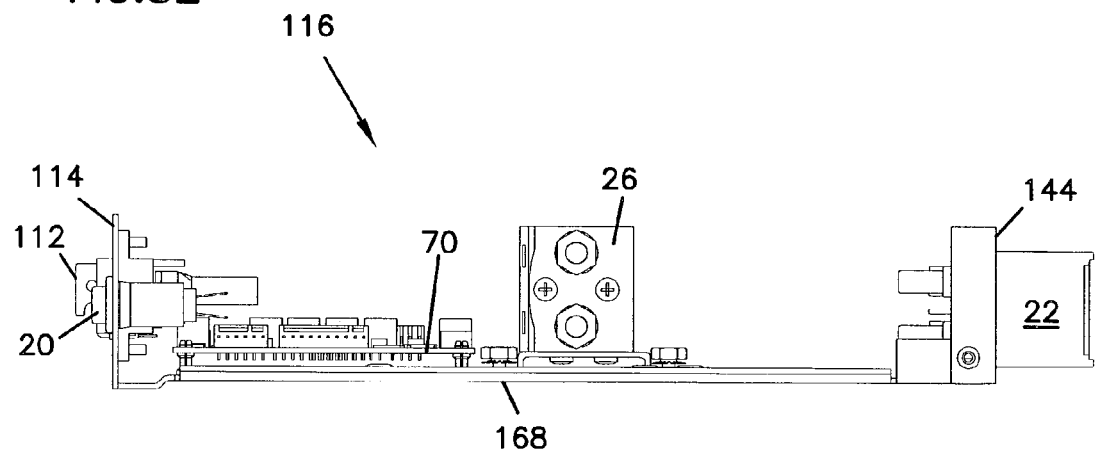
FIG. 32 is a second side view of the module of FIG. 28.

Each module 16 shown in FIGS. 1 and 2 includes two sets of power input terminals 22 for receiving power from two power sources. Each set of terminals 22 are electrically linked by circuitry within module 16 through fuses 12 to a plurality of power output terminals 24. The electrical connections between the different components within module 16 are shown in FIG. 14, which is a circuit diagram for module 16. Additional details of modules 16 are described below with regard to FIGS. 9 through 14.

While high current in the power supply circuit may damage the equipment, low voltage conditions may also adversely impact the function of the equipment. Thus, each power input terminal 22 is connected with a power input contactor 26 and also connected to a low voltage detection circuit on a circuit board 70. When one of the low voltage detectors on board 70 detects a low voltage condition in one of the power inputs, that detector generates an alarm and illuminates an associated low voltage alarm lamp 18 also mounted to front face 14 to indicate which power input terminal 22 is connected to a low voltage source. At the time the alarm is generated, the low voltage detector signals contactor 26 which in turn disconnects the input source from fuses 12 and power output terminals 24. Also mounted on front face 14 is a power indicator lamp 20 associated with each power input terminal 22 to indicate if power is being supplied through the associated input terminal.

Panel 10 includes a chassis 38 with a top 28, a bottom 30 and a pair of sides 32 which cooperate to define an interior 34. Attached along each side 32 is a mounting flange 36. Flange 36 facilitates the mounting of panel 10 to an equipment rack or other structure adjacent electronic equipment requiring power management. In top 28 adjacent a front edge 42 are a plurality of ventilation slots 40. Slots 40 are angled approximately forty-five degrees from front edge 42. Slots 40 provide an exit for heated air to escape interior 34. The angling of slots 40 aids in controlling of flame spread should the components within panel 10 become overheated. Angling of ventilation slots for telecommunications equipment is disclosed in further detail in commonly-owned U.S. application Ser. No. 09/725,339, the disclosure of which is incorporated herein by reference. Additional details of chassis 10 are provided below with regard to FIGS. 15 through 19.

Figure 4:
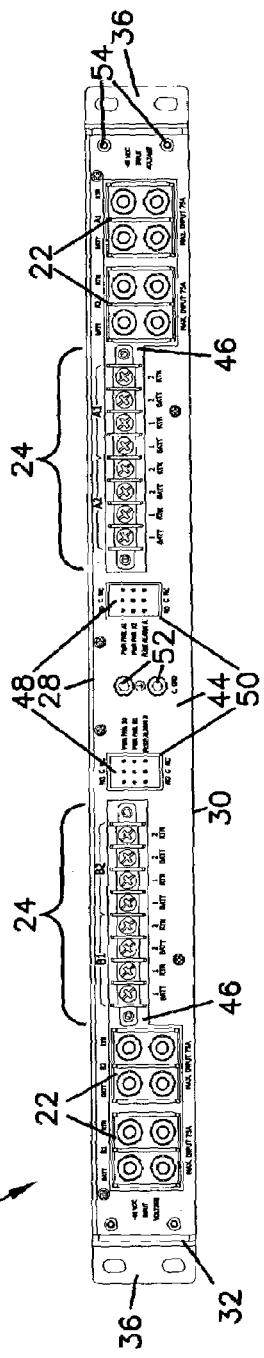
FIG. 4 is a rear view of the power panel of FIG. 1.

Referring now to FIGS. 4, 15 and 16, panel 10 includes a rear wall 44 which further defines interior 34 is conjunction with top 28, bottom 30 and sides 32. A pair of openings 46 are defined in rear wall 44. Power input connectors 22 and power output connectors 24 extend through openings 46. Also defined in rear wall 44 is a pair of openings 50 through which a plurality of alarm connectors 48 extend. Alarm connectors 48 allow remote monitoring of the status of fuses 20 in module 16. Mounted to rear wall 44 between openings 46 are ground posts 52 which provide a common ground source that can be used to ground an equipment rack or other equipment mounted to a rack. A plurality of removable fasteners 54 extend through front face 14 of module 16 serve to releasably fasten module 16 to panel 10. More or fewer fasteners 54 may be included to fasten module 16 to panel 10 but all fasteners should be accessible from the front or the rear of panel 10 and not require access to the top or bottom of panel 10. This positioning of fasteners 54 will permit modules 16 to be removed and inserted into panel 10 without removal of panel 10 from an equipment rack or removal of equipment mounted in such a rack adjacent above or below panel 10.

Figure 5:
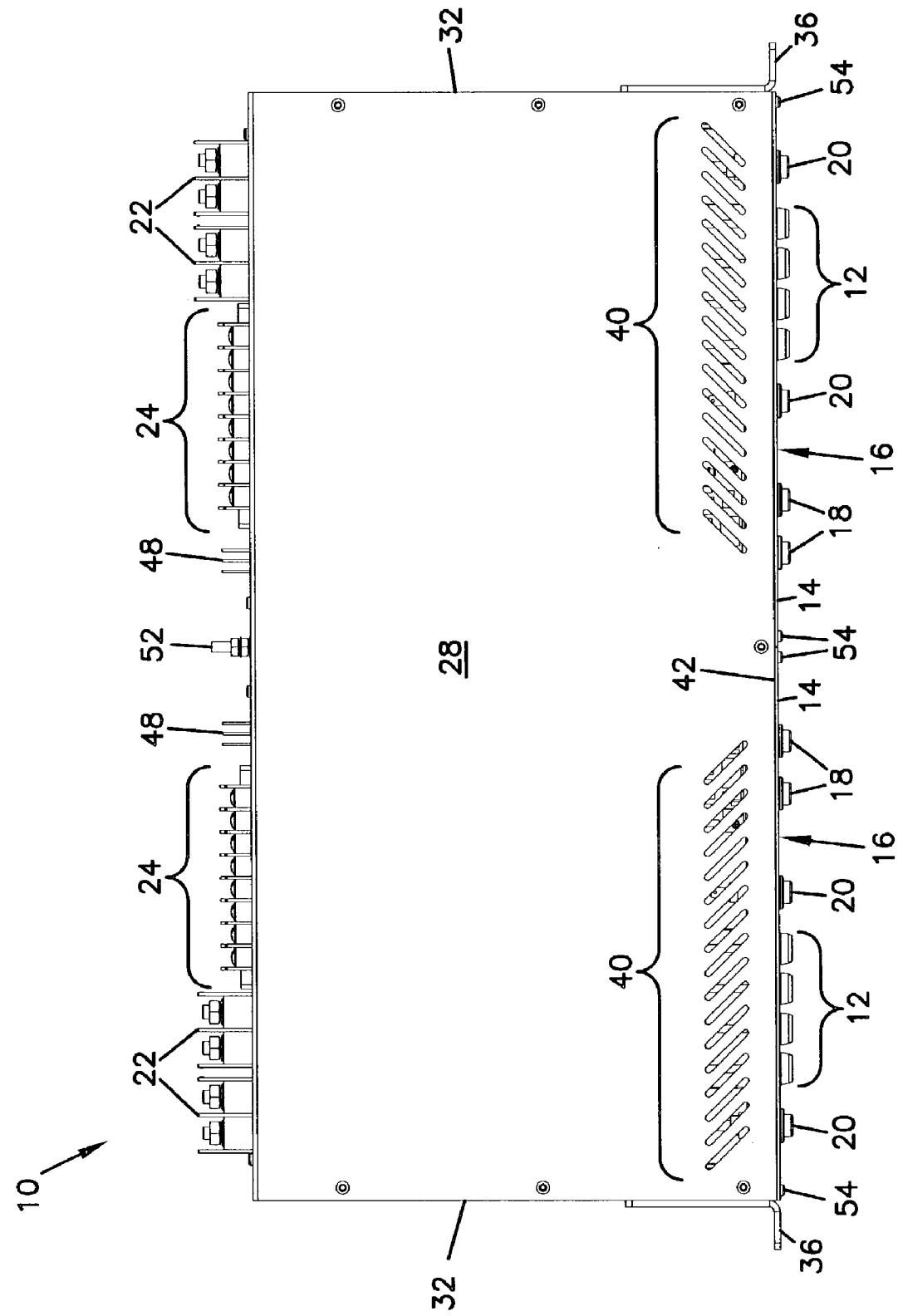
FIG. 5 is a top view of the power panel of FIG. 1.
Figure 6:
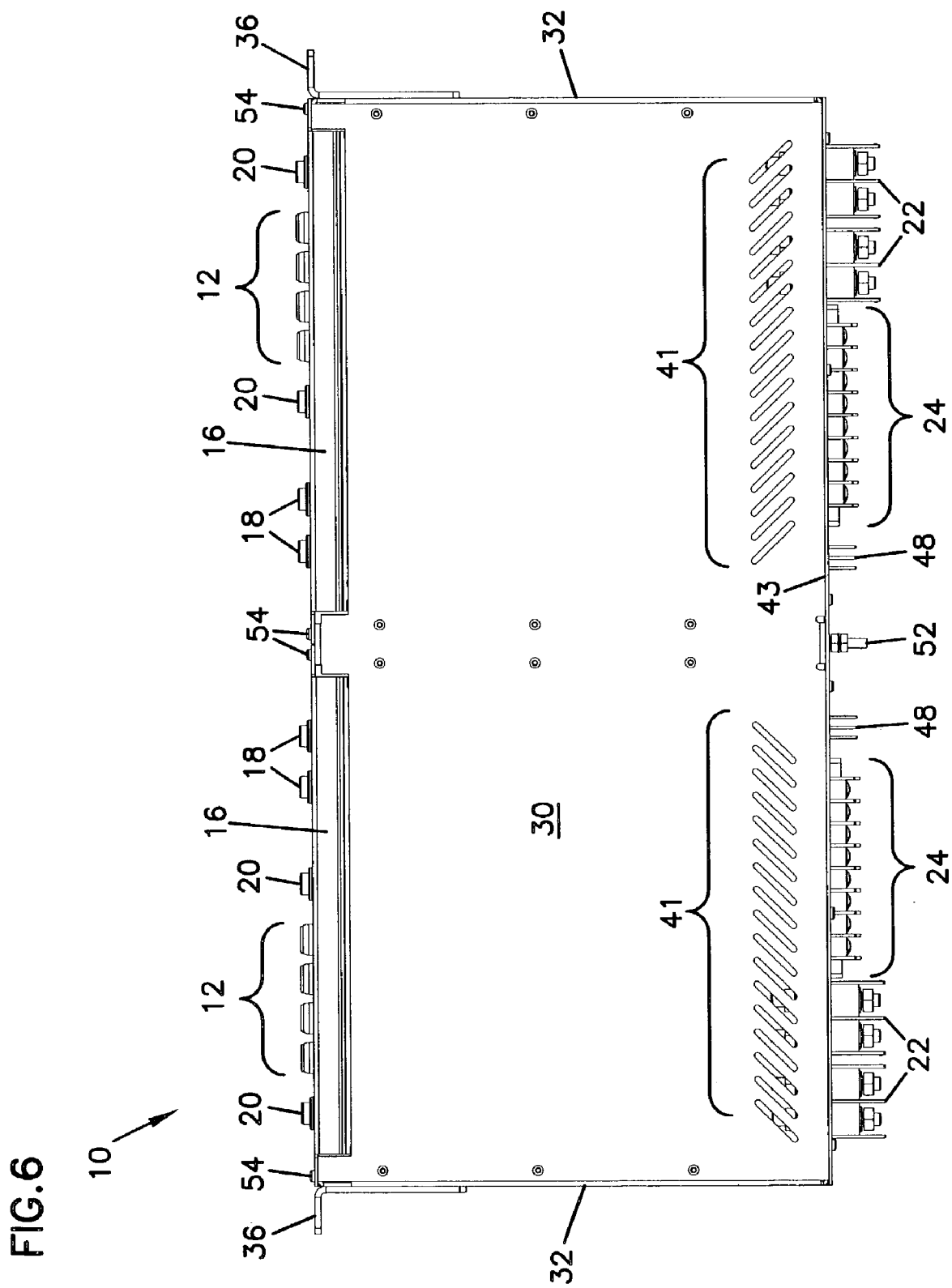
FIG. 6 is a bottom view of the power panel of FIG. 1.
Figure 7:
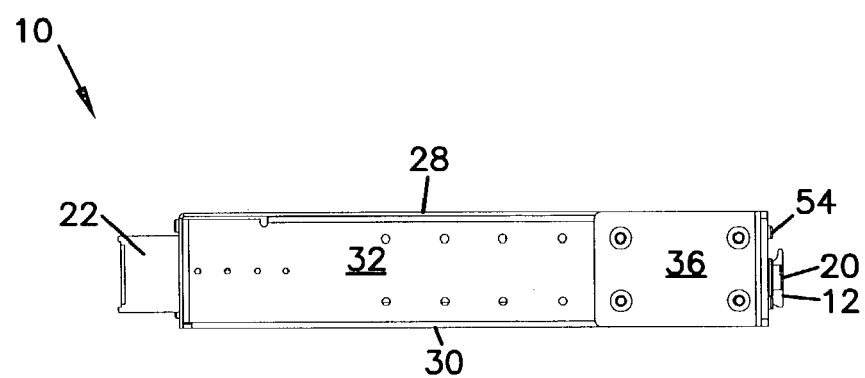
FIG. 7 is a first side view of the power panel of FIG. 1.
Figure 8:
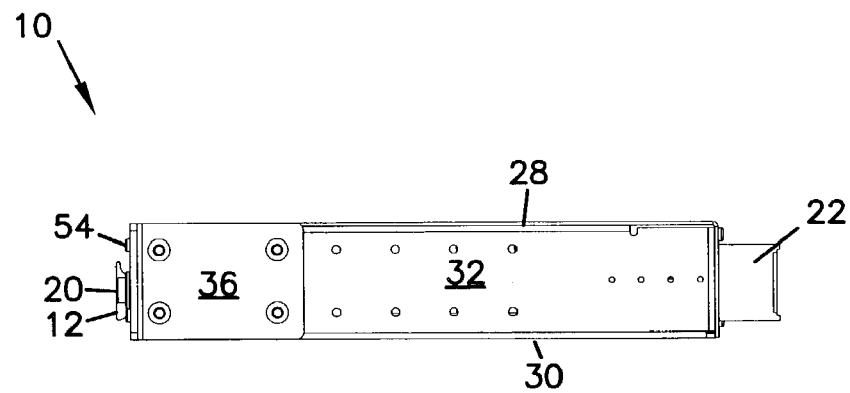
FIG. 8 is a second side view of the power panel of FIG. 1.
Figure 10:
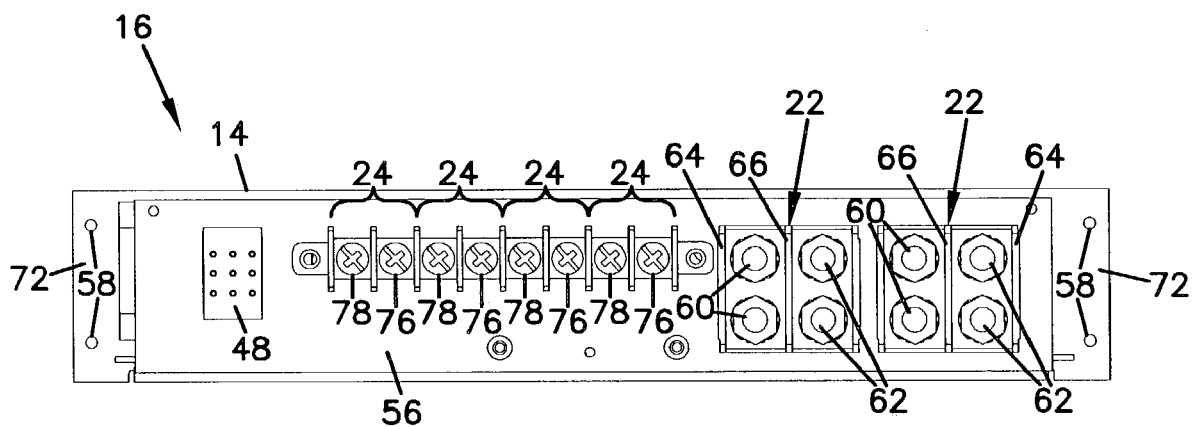
FIG. 10 is a rear view of the module of FIG. 9.
Figure 9:
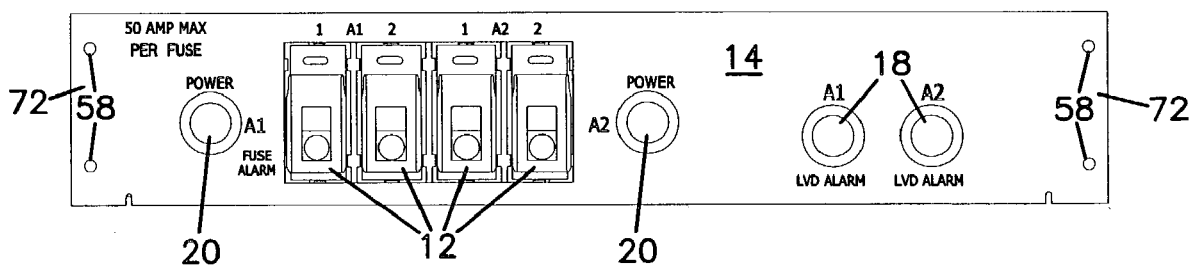
FIG. 9 is a front view of one of the modules inserted in the power panel of FIG. 1.

Referring now to FIGS. 5 and 6, a plurality of ventilation slots 41 are located in bottom 30 adjacent a rear edge 43. Slots 41 are angled similarly to slots 40 in top 28. The combination of slots 41 adjacent rear edge 43 and slots 40 adjacent front edge 42 promote a cross ventilation airflow path within panel 10, as described in the above-referenced commonly-owned application.

Referring now to FIGS. 9 through 13, module 16 includes a tray 68 which forms the floor of module 16. Front wall 14 extends vertically from one end of tray 68. On the opposite end of tray 68 is a vertical rear wall 56. Front wall 14, rear wall 56 and tray 68 cooperate to define an interior 55 of module 16. The components of module 16 are mounted within interior 55 to one of tray 68, front wall 14 or rear wall 56. Front wall 14 includes fastener openings 58 in a pair of mounting flanges 72 which extend from either side of front wall 14. The maximum width of tray 56 is defined by a pair of opposing sides 74, which also form slide rails for mounting module 16 within module 10.

Each power input terminal 22 includes a housing 64 with a central dividing wall 66. On opposite sides of the dividing wall 66 are a pair of battery connector posts 60 and a pair of return connectors posts 62. The battery and return connectors both use a pair of posts 60 and 62, respectively, to improve contact with a cable from a power source and aid in the transmission of power through terminal 22. Posts 60 and 62 extend through power input terminal 22 and through rear wall 56 into interior 55. Circuitry (see FIG. 14) links posts 60 and 62 to contactors 26, power lamps 20, fuses 12, and to power output terminals 24. Each power output terminal 24 includes a return post 76 and a battery post 78. The circuitry may include busbars, wires or other types of electrical conductors which will aid in the delivery and distribution of electrical current between input terminals 22 to output terminals 24.

Within module 16 is circuit board 70 which includes logic circuits for detecting low voltage conditions in the power being input through input terminals 22 and for signaling a low voltage alarm and triggering contactors 26 to break the circuit if a low voltage condition is detected. Board 70 is also linked to fuses 12 for the purposes of triggering a fuse alarm which might signal a problem or interruption of power delivered through power output connectors 24. In the event of a low voltage alarm, circuit board 70 also triggers lamp 18 to be illuminated while the shutting off the input power from terminal 22 will also shut off the associated power lamp 20. In the event of a fuse alarm, circuit board 70 would send a signal through alarm connectors 48 to a remote monitoring system.

Figure 11:
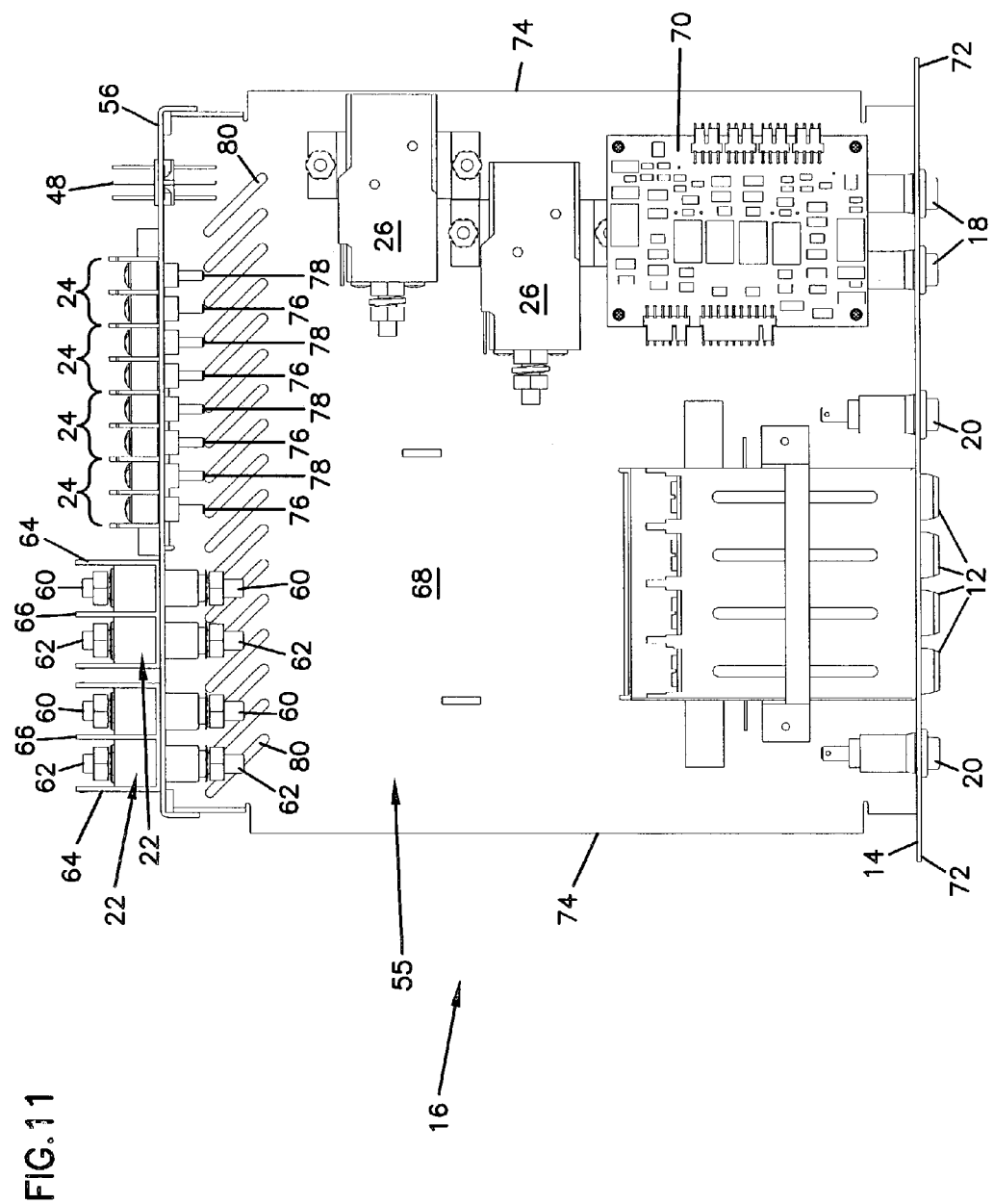
FIG. 11 is a top view of the module of FIG. 9.
Figure 12:
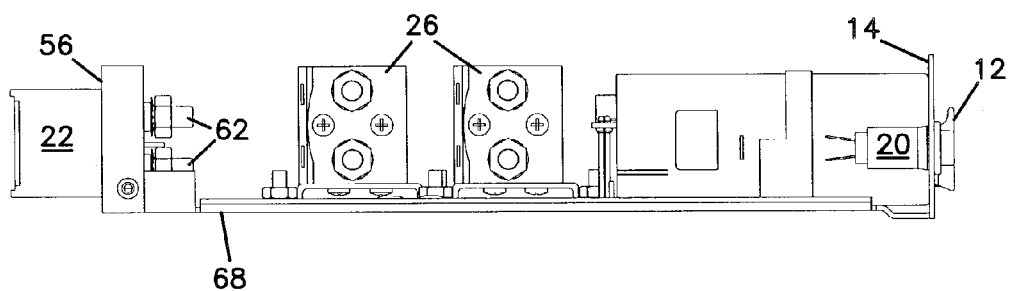
FIG. 12 is a first side view of the module of FIG. 9.
Figure 13:
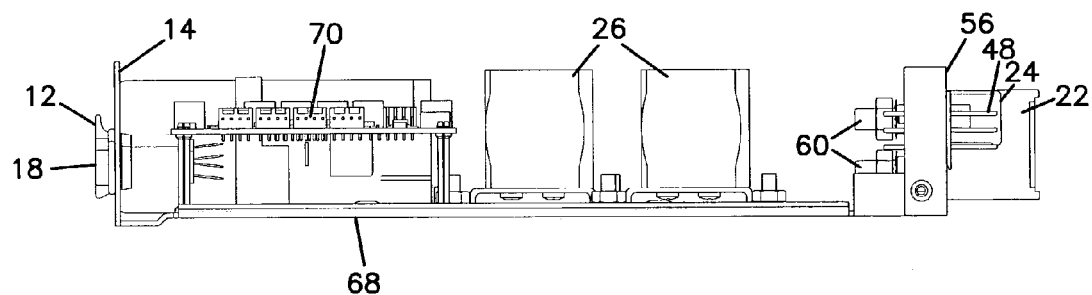
FIG. 13 is a second side view of the module of FIG. 9.

Tray 68 also includes a plurality of ventilation slots 80, shown in FIG. 11. When module 16 is inserted within a chassis 38 as part of a panel 10, slots 80 are positioned above and angled similarly to slots 41 of bottom 30. This position and orientation aids in improving airflow through slots 41 and slots 80, across the components of module 16 and out of panel 10 through slots 42 in top 28.

As discussed above, FIG. 14 shows diagrammatically the circuitry connecting the components of module 16. It is understood that a variety of conductors and methods can be used to carry the current between the components in the manner illustrated in FIG. 14, provided that all conductors must fit within interior 55 of module 16 to that module 16 may be mounted within chassis 38 to assemble a panel 10.

As shown, module 16 has a pair of power input terminals 22 each of which provides power to two output terminals 24 through two fuses 12. Panel 10 includes two modules 16. Thus, panel 10 can receive power from up to four different power sources and provide power to up to eight different devices. Each device receiving power from panel 10 receives power through a separate circuit including circuit protection in the form of a fuse 12. It is anticipated that other configurations and arrangements of modules for use with panel 10 may be provided with more or fewer input and output terminals. These terminals may be connected with circuitry having different types of circuit protection devices, such as different fuse types, or circuit breakers. The circuitry may or may not include fuse alarms or low voltage detectors and alarms. Alternative power panels may have more or fewer modules. These various alternative embodiments are within the concept of the present invention.

Referring now to FIGS. 15 through 19, chassis 38 is illustrated in further detail. Openings 46 and 50 are defined in rear wall 44. A central support 82 extends between top 28 and bottom 30 and receives several fasteners 54 for mounting modules 16 within interior 34. One of the modules 16 is inserted into interior 34 through an opening 86 defined by front edge 42 of top 28, a front edge 88 of bottom 30, a mounting flange 90 extending from one of the sides 32 and central support 82. Central support 82 and flanges 90 are located adjacent front edges 88 and 42. Edges 74 of tray 68 are received in a pair of guide rails 84 within interior 34. Each guide rail 84 is positioned adjacent bottom 30 on either side of opening 86 and extends generally from front edge 88 to rear edge 43. Guide rails 84 position module 16 vertically within interior 34 so that input and output terminals 22 and 24 are correctly located to extend through opening 46 and to ensure that openings 58 of module 16 are properly positioned to receive fasteners 54.

When fully inserted within interior 34, as shown in the earlier FIGS., module 16 will be positioned with one flange 72 adjacent mounting flange 90 and one adjacent central support 82. Fasteners 54 can be inserted through openings 58 of flanges 72. In this inserted position, power input terminals 22 and power output terminals 24 extend through opening 46, while alarm connectors 48 extend through opening 50.

Referring now to FIGS. 20 through 32, an alternative power panel 110 with a pair of alternative modules 116 is shown. Panel 110 and module 116 are configured similarly to panel 10 and module 16, with several distinctions noted below. Module 116 includes a single power input terminal 22 and ten power output terminals 24. A single contactor 26 is mounted to module 116 and linked to a low voltage detection circuit on board 70 to monitor the power input to module 116 through input terminal 22. Module 116 includes ten fuses 112 mounted to front face 14 along with a single low voltage alarm lamp 18 and a single power lamp 20. Fuses 112 are GMT fuses.

Thus configured, module 116 can receive power from a single source and distribute the power through circuitry into ten individually protected circuits to a total of ten devices. With two modules 116 installed, panel 110 can supply power to a total of twenty devices. Each input terminal 22 includes housing 64 with central wall 66 separating battery posts 60 from return posts 62. Each output terminal 24 includes a return post 76 and a battery post 78.

Rear face 144 of an alternative chassis 138 includes an opening 146 for each module 116 to permit output terminals 24 to extend through and an opening 147 to permit input terminals 22 to extend through. Opening 50 and ground posts 52 are sized and configured similarly to rear face 44. The remainder of chassis 138 is substantially similar to chassis 38, described above.

Mounted to front face 114 of module 116 is a fuse alarm lamp 19 to provide a visual indication of the presence of a fuse alarm. Circuit board 70 would illuminate lamp 19 when a fuse alarm is sent to the remote monitoring system through alarm connector 48.

Panels 10 and 110 permit the repair or replacement of either of the two modules 16 or 116, respectively, without disturbing the mounting of panel 10 or 110, or the other module. Modules 16 and 116 may be removed and replaced from the front of panel in which it is mounted. For example, to replace one of the modules 16 mounted in panel 10, the power supply cables connected to power input connectors 22 of module 16 to be replaced would be detached, as would any cables connected power output connectors 24 to other devices. Alarm cables attached to alarm connectors 48 would also need to be detached. The cables connected to the adjacent module 16 would not need to be disturbed and the equipment which the other module 16 is provided power to would not need to be taken offline and depowered. Fasteners 54 would be removed from openings 58 on flanges 72 of the module 16 being replaced. The module can then be withdrawn from interior 34 through opening 86 in the front of panel 10.

A similarly configured replacement module 16 can then be placed in opening 86 with edges 74 within guide rails 84 and slide fully into panel 10. Flanges 72 would be adjacent central support 82 and side flanges 90 so that fasteners 54 can be inserted through openings 58 and engage panel 10 to hold module 16 in place with interior 34. Power cables can then be connected to power output terminals 24, the alarm cables connected to alarm connectors 48 and power cables connected to power input terminals 22. The new module 16 is now in service and can be used to provide power to other devices. Note that this module replacement was performed without disturbing the power supplied to devices by the adjacently mounted module 16 and without dismounting panel 10 from whatever mounting structure panel 10 might be installed in.

Referring now to FIGS. 33 and 34, a second alternative chassis 238 includes a second alternative back plate 244. Back plate 244 is configured with openings 146 sized to receive input terminals 22 and output terminals 24 of either module 16 or module 116, as well as other modules with different configurations of input terminals and output terminals. A portion 150 of openings 146 of back plate 244 is provided for alarm connectors 48 to extend through. Back plate 244 also includes common ground posts 52. Due to the desire to have back plate 244 receive a variety of different configuration modules, a greater degree of flexibility of installation is provided by chassis 238.

It should be noted that modules intended for use with chassis 238 including back plate 244 will preferably include marking on the module to indicate the nature and capacity of the components on the module, as well as the configuration of alarm connections 48. It should also be noted that chassis 38, 138 and 238 are shown configured and sized to occupy two rack units on a telecommunication rack, so that the overall chassis height does not exceed 3.5 inches. It is anticipated that the present invention may be increased or decreased in height as necessary for the particular constraints of the installation and the amount of power to be distributed to other equipment by panel 10.

With regard to the foregoing description, it is to be understood that changes may be made in detail, especially in matters of the construction materials employed and the shape, size and arrangement of the parts without changing the scope of the present invention. It is intended that the specification and depicted aspects be considered exemplary only, with the true scope and spirit of the invention being indicated by the broad meaning of the following claims.

What is claimed is as follows:

1. A power distribution panel comprising:
   a chassis including a top, a bottom, and a pair of opposing sides defining an interior with a first opening and a second opposing opening, each of the sides including a flange adapted to mount the chassis to a rack;
   the chassis including a rear face, the rear face including the second opening;
   first and second modules, each module with a bottom, a first face and a second face, and including a power input terminal, a plurality of power output terminals, and an electrical circuit connecting each power output terminal to the power input terminal, each circuit including a circuit protection device;
   the power input terminal, the power output terminals and the circuit protection devices mounted to one of the first or second faces;
   each module configured to be received through the first opening and removably mounted within the interior;
   wherein the power input and power output terminals are accessible through the second opening and the circuit protection devices are accessible through the first opening when each module is mounted within the chassis;
   wherein each module includes an alarm circuit and an alarm circuit connector, the alarm circuit connector accessible through the rear face.

2. The power distribution panel of claim 1, wherein the second opening includes a first portion for the power input terminals, and a second portion for the power output terminals, the first portion in communication with the second portion for each module.

3. The power distribution panel of claim 1, wherein the second opening includes a first portion for the power input terminals, and a second portion for the power output terminals, the first portion separate from the second portion for each module.

4. The power distribution panel of claim 1, wherein a low voltage detection circuit is connected to the power input terminal and generates a low voltage alarm signal when a low voltage condition is detected.

5. The power distribution panel of claim 4, wherein the low voltage alarm detection circuit includes an indicator lamp, and wherein the low voltage alarm illuminates the indicator lamp when a low voltage condition is detected, the indicator lamp mounted to the first face of each module and visible through the first opening when each module is mounted within the chassis.

6. The power distribution panel of claim 1, wherein the first face of each module closes the first opening and the second face of each module closes the second opening when each module is mounted within the chassis.

7. The power distribution panel of claim 1, wherein the circuit protection device in each circuit includes a circuit breaker.

8. The power distribution panel of claim 1, wherein the circuit protection device in each circuit includes a fuse.

9. The power distribution panel of claim 1, wherein the second module is configured as a mirror image of the first module.

10. The power distribution panel of claim 1, wherein each module includes a pair of edges on opposing sides, the interior includes a pair of guide rails which receive the edges, and wherein the input and output terminals are positioned for extension into the second opening with the edges within the guide rails.

11. The power distribution panel of claim 1, wherein the rear face includes at least one ground post.

12. A power distribution module comprising:
    a platform with a floor having a first end and an opposite second end, a first face extending upward from the floor adjacent the first end, a second opposing face extending upward from the floor adjacent the second end;
    a power input terminal mounted to one of the first and second faces;
    a plurality of power output terminals mounted to one of the first and second faces;
    a plurality of circuits, each circuit connecting one of the power output terminals to the power input terminal, each circuit including a circuit protection device, each circuit protection device mounted to one of the first and second faces, the plurality of circuits including an alarm circuit and an alarm circuit connector;
    the platform having an open top and open sides;
    wherein the alarm circuit connector, the power input terminal and the power output terminals are mounted to the same face of the first and second faces and the circuit protection devices are mounted to the other of the first and second faces;
    wherein the platform includes two opposing side edges extending in a direction from the first end toward the second end and defining outwardly extending flanges.

13. The power distribution module of claim 12, wherein the floor of the platform includes a plurality of ventilation slots.

14. The power distribution module of claim 12, wherein a low voltage detection circuit is connected to the power input terminal and generates a low voltage alarm signal when a low voltage condition is detected.

15. The power distribution module of claim 14, wherein the low voltage alarm detection circuit includes an indicator lamp, and wherein the low voltage alarm illuminates the indicator lamp when a low voltage condition is detected, the indicator lamp mounted to the first face of the module.

16. A method of replacing a power distribution circuit in a power distribution panel, the method comprising the steps of:
    providing the power distribution circuit mounted to a tray defining a module, the module removably mounted within a chassis with a top, a bottom, and a pair of opposing sides defining a front opening, a rear opening and an interior, the module including a plurality of power output terminals extending through the rear opening, a power input terminal extending through the rear opening, a circuit connecting each power output terminal with the power input terminal, each circuit including a circuit protection device;
    wherein the module is a first module and further comprising a second module positioned within the chassis horizontally adjacent to the first module, the second module including a plurality of power output terminals extending through the rear opening, a power input terminal extending through the rear opening, a circuit connecting each power output terminal with the power input terminal, each circuit including a circuit protection device, wherein the first and second modules are independently mounted within the interior through the front opening;

detaching any power input cables from the power input terminal of the first module;

detaching any power output cables from the power output terminals of the first module;

removing the first module from the chassis through the front opening;

inserting a replacement module into the chassis through the front opening, the replacement module including a plurality of power output terminals extending through the rear opening, a power input terminal extending through the rear opening, a circuit connecting each power output terminal with the power input terminal, each circuit including a circuit protection device;

wherein the first module, the replacement module and the second module each include an alarm circuit carried by each respective module, each alarm circuit having an alarm circuit connector extending through the rear opening of the chassis;

wherein any alarm cables are detached from the alarm circuit connector of the first module before the step of removing the first module from the chassis;

wherein the steps of removing the first module and inserting the replacement module occur while power is supplied to the second module and the alarm circuit of the second module is active.

17. A power distribution panel comprising:

a chassis including a top, a bottom, a pair of opposing sides, and a rear wall cooperating to define an interior and a front opening into the interior, the rear wall including a plurality of openings;

a pair of power distribution modules releasably mounted within the interior and slidably removable through the front opening, the modules positioned horizontally relative to one another;

each module including a power input terminal, a plurality of power output terminals, and circuitry connecting each power output terminal to the power input terminal, each circuit including a circuit protection device;

the power input terminals and the power output terminals extending through one of the openings in the rear wall of the chassis;

the circuit protection devices accessible through the front opening of the chassis;

wherein each module includes an alarm circuit and an alarm circuit connector, the alarm circuit connector of each module extending through one of the openings in the rear wall of the chassis;

wherein each module is independently mounted within the interior through the front opening.

18. The power distribution panel of claim 17, wherein the power input terminals and the power output terminals of each module extend through the same opening in the rear wall of the chassis.

19. The power distribution panel of claim 17, wherein the power input terminals and the power output terminals of each module extend through separate openings in the rear wall of the chassis.

20. The power distribution panel of claim 17, wherein each module includes a pair of opposing edges and the interior includes a pair of guide rails for slidably receiving the opposing edges of each module, the opposing edges and guide rails extending from adjacent the front opening toward the rear wall.

21. The power distribution panel of claim 17, wherein the modules each include a front face to which the circuit protection devices are mounted.

22. The power distribution panel of claim 21, wherein the front face of each module extends from the top to the bottom of the chassis and occludes a portion of the front opening, the two front faces cooperating to substantially close the front opening.

23. The power distribution panel of claim 17, wherein a low voltage detection circuit is connected to the power input terminal and generates a low voltage alarm signal when a low voltage condition is detected.

24. The power distribution panel of claim 23, wherein the low voltage alarm detection circuit includes an indicator lamp, and wherein the low voltage alarm illuminates the indicator lamp when a low voltage condition is detected, the indicator lamp mounted to the first face of the module.

25. The power distribution panel of claim 23, wherein the low voltage alarm signal disconnects the power input terminal from the power output terminals.

* * * * *